United States Patent [19]

Nakamura et al.

[11] Patent Number: 5,714,767
[45] Date of Patent: Feb. 3, 1998

[54] METHOD FOR MANUFACTURING SUPERCONDUCTING DEVICE HAVING A REDUCED THICKNESS OF OXIDE SUPERCONDUCTING LAYER AND SUPERCONDUCTING DEVICE MANUFACTURED THEREBY

[75] Inventors: Takao Nakamura; Hiroshi Inada; Michitomo Iiyama, all of Osaka, Japan

[73] Assignee: Sumitomo Electric Industries, Ltd., Osaka, Japan

[21] Appl. No.: 551,366

[22] Filed: Nov. 1, 1995

Related U.S. Application Data

[63] Continuation of Ser. No. 171,768, Dec. 22, 1993, abandoned, which is a continuation of Ser. No. 783,680, Oct. 29, 1991, abandoned.

[30] Foreign Application Priority Data

Oct. 30, 1990 [JP] Japan ................ 2-292816
Oct. 30, 1990 [JP] Japan ................ 2-292817

[51] Int. Cl.$^6$ ............................. H01L 29/06
[52] U.S. Cl. ............... 257/39; 257/30; 505/193; 505/237
[58] Field of Search .............. 357/5, 4; 505/1, 505/190–193, 234, 235, 237, 239, 701–703; 427/62, 63; 257/33, 35, 36–39

[56] References Cited

U.S. PATENT DOCUMENTS 4,984,036  1/1991  Sakamoto et al. ............ 257/284
5,096,882  3/1992  Kato et al. ................... 505/237

FOREIGN PATENT DOCUMENTS 0280308   8/1988   European Pat. Off. .
0324044   7/1989   European Pat. Off. ......... 357/5
0354804   2/1990   European Pat. Off. .
63-269585 11/1988   Japan .
1700080   7/1989   Japan ......................... 357/5
3191581   8/1991   Japan ......................... 357/5

OTHER PUBLICATIONS

Yoshida et al, "Monolithic Device Fabrication Using High–TC Superconductor", IEDM Technical Digest, IEDM, 1988 pp. 282–285.

Primary Examiner—Sara W. Crane
Attorney, Agent, or Firm—Beveridge, DeGrandi, Weilacher & Young, L.L.P.

[57] ABSTRACT

For manufacturing a superconducting device, a compound layer which is composed of the same constituent elements of an oxide superconductor is formed on a surface of the substrate, and a gate electrode is formed on a portion of the compound layer. Portions of the compound layer at both sides of the gate electrode are etched using the gate electrode as a mask, so that a shallow step is formed on an upper surface of the compound layer and side surfaces of the step exposed. After that electric power is applied to the gate electrode to heat the gate electrode so as to carry out a heat-treatment on the portion of the compound layer under the gate electrode locally, so that a gate insulator formed directly under the the gate electrode and a superconducting channel which is constituted an extremely thin superconducting region composed of the oxide superconductor and formed under the gate insulator are produced in a self alignment to the gate electrode.

19 Claims, 6 Drawing Sheets

METHOD FOR MANUFACTURING SUPERCONDUCTING DEVICE HAVING A REDUCED THICKNESS OF OXIDE SUPERCONDUCTING LAYER AND SUPERCONDUCTING DEVICE MANUFACTURED THEREBY

This application is a continuation of application Ser. No. 08/171,768, filed Dec. 22, 1993 (now abandoned), which is a continuation of application Ser. No. 07/783,680, filed Oct. 29, 1991 (now abandoned), which applications are entirely incorporated herein by reference.

BACKGROUND OF THE INVENTION

1. Field of the Invention

The present invention relates to a method for manufacturing a superconducting device, and more specifically to a method for manufacturing a superconducting device including an oxide superconducting layer having a partially reduced thickness portion forming a superconducting channel controlled by a gate electrode, and a superconducting device manufactured by the method.

2. Description of Related Art

Typical three-terminal devices which utilize a superconductor include a so called superconducting-base transistor and a so called super-FET (field effect transistor). The superconducting-base transistor includes an emitter of a superconductor or a normal conductor, a tunnel barrier of an insulator, a base of a superconductor, a semiconductor isolator and a collector of a normal conductor, stacked in the named order. This superconducting-base transistor operates at a high speed with a low power consumption, by utilizing high speed electrons passing through the tunnel barrier.

The super-FET includes a semiconductor layer, and a superconductor source electrode and a superconductor drain electrode which are formed closely to each other on the semiconductor layer. A portion of the semiconductor layer between the superconductor source electrode and the superconductor drain electrode has a greatly recessed or undercut rear surface so as to have a reduced thickness. In addition, a gate electrode is formed through a gate insulator layer on the recessed or undercut rear surface of the portion of the semiconductor layer between the superconductor source electrode and the superconductor drain electrode.

A superconducting current flows through the semiconductor layer portion between the superconductor source electrode and the superconductor drain electrode due to a superconducting proximity effect, and is controlled by an applied gate voltage. This super-FET operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

Both of the above mentioned superconducting-base transistor and the super-FET have a portion in which a semiconductor layer and a superconducting layer are stacked to each other. However, it is difficult to form a stacked structure of the semiconductor layer and the superconducting layer formed of an oxide superconductor which has been recently advanced in study. In addition, even if it is possible to form a stacked structure of the semiconductor layer and the oxide superconducting layer, it is difficult to control a boundary between the semiconductor layer and the oxide superconducting layer. Therefore, a satisfactory operation could not been obtained in these superconducting devices.

In addition, since the super-FET utilizes the superconducting proximity effect, the superconductor source electrode and the superconductor drain electrode have to be located close to each other at a distance which is a few times the coherence length of the superconductor materials of the superconductor source electrode and the superconductor drain electrode. In particular, since an oxide superconductor has a short coherence length, if the superconductor source electrode and the superconductor drain electrode are formed of the oxide superconductor material, a distance between the superconductor source electrode and the superconductor drain electrode has to be not greater than a few ten nanometers. However, it is very difficult to conduct a fine processing such as a fine pattern etching so as to ensure the very short separation distance. Because of this, in the prior art, it has been impossible to manufacture the super-FET composed of the oxide superconductor material.

Furthermore, it has been confirmed that the conventional three-terminal superconducting device having the superconducting channel shows a modulation operation. However, the conventional three-terminal superconducting device having the superconducting channel could not realize a complete ON/OFF operation, because a carrier density is too high. In this connection, since an oxide superconductor material has a low carrier density, it is expected to form a three-terminal superconducting device which has a superconducting channel and which can realize the complete ON/OFF operation, by forming the superconducting channel of the oxide superconductor material. In this case, however, a thickness of the superconducting channel has to be made on the order of 5 nanometers.

SUMMARY OF THE INVENTION

Accordingly, it is an object of the present invention to provide a method for manufacturing a superconducting device, which have overcome the above mentioned defects of the conventional ones.

Another object of the present invention is to provide a method for manufacturing an FET type superconducting device including an oxide superconducting layer having an extremely thin portion forming a superconducting channel, with a good repeatability by using existing established processing techniques.

Still another object of the present invention is to provide an FET type superconducting device having a unique structure which have overcome the above mentioned defects of the conventional ones.

The above and other objects of the present invention are achieved in accordance with the present invention by a method for manufacturing a superconducting device, the method comprising the step of forming on a surface of the substrate a compound layer which is composed of the same constituent elements of an oxide superconductor, forming on a portion of the compound layer a gate electrode, etching portions of the compound layer at both sides of the gate electrode using the gate electrode as a mask, so that a shallow step is formed on an upper surface of the compound layer and side surfaces of the step exposed, and applying electric power to the gate electrode to heat the gate electrode so as to carry out a heat-treatment on the portion of the compound layer under the gate electrode locally, so that a gate insulator formed directly under the the gate electrode and a superconducting channel which is constituted an extremely thin superconducting region composed of the oxide superconductor and formed under the gate insulator are produced in a self alignment to the gate electrode.

According to another aspect of the present invention, there is provided a superconducting device which comprises a superconducting device comprising a substrate, a first thin film portion of an oxide superconductor having an extremely thin thickness, a second thin film portion of an oxide superconductor positioned at one end of the first thin film portion, a third thin film portion of an oxide superconductor positioned at the other end of the first thin film portion, a first electrode formed on the second thin film portion and a second electrode formed on the third thin film portion, and a gate electrode formed on a gate insulator directly on the first thin film portion of the oxide superconductor positioned on the projecting insulating region of the substrate, so that the superconducting current flowing between the first and second electrodes through the first thin film portion of the oxide superconductor is controlled by a voltage applied to the gate electrode.

In a preferred embodiment, the compound layer is an oxide superconductor thin film and the heat-treatment is carried out under high vacuum so that oxygen of the crystals of the portion of the oxide superconductor thin film just under the gate electrode escapes through the side surfaces so as to convert the portion into a non-superconducting compound oxide material and to constitute an extremely thin superconducting region under the non-superconducting compound oxide material layer.

Preferably, the oxide superconductor thin film is formed as thick as the sum of the necessary thickness of the superconducting channel and of the gate insulator.

In another preferred embodiment, the compound layer does not show superconductivity but will become an oxide superconductor when the compound layer is heated in an oxygen atmosphere or when oxygen ions are injected and the heat-treatment is carried out in an oxygen atmosphere so that the oxygen is diffused through the side surfaces into a portion of the compound layer under the gate electrode in a lateral direction so as to constitute an extremely thin superconducting region.

In this connection, before the heat-treatment is carried out, oxygen ions are selectively injected into two portions of the compound layer separated from each other, so that the two separated portions of the compound layer are converted into a pair of thick superconducting regions composed of the oxide superconductor.

Preferably, the compound layer is formed of a compound oxide which is composed of the same constituent elements as those of an oxide superconductor but includes the oxygen amount less than that of the oxide superconductor, so that the compound oxide layer will be brought into an oxide superconductor when the compound oxide layer is heated in an oxygen atmosphere or when oxygen ions are injected.

It is desired that the abovementioned oxide superconductor is a high-$T_c$ (high critical temperature) oxide superconductor. This high-$T_c$ oxide superconductor has been studied by many researchers since the discovery of Bednorz and M üller in 1986, and is said to indicate oxide superconductor having a critical temperature of not less than 30K. More specifically, the oxide super conductor is a high-$T_c$ copper-oxide type compound oxide superconductor including a Y—Ba—Cu—O type compound oxide superconductor, a Bi—Sr—Ca—Cu—O type compound oxide superconductor and a Tl—Ba—Ca—Cu—O type compound oxide superconductor.

In addition, the substrate, on which the oxide superconductor thin film or the compound layer is deposited, can be formed of an insulating substrate, preferably an oxide single crystalline substrate such as MgO, $SrTiO_3$, $CdNdAlO_4$, etc. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a $MgAlO_4$ layer and a $BaTiO_3$ layer if silicon is used as a substrate.

In the superconducting device manufactured in accordance with the present invention, the superconducting current flowing between the second and third oxide superconducting regions through the superconducting channel formed of the first oxide superconducting region is controlled by a voltage applied to the gate electrode. Namely, the superconducting device constitutes the super-FET. In order to ensure that the superconducting channel can be turned on and off by a voltage applied to the gate electrode, a thickness of the superconducting channel has to be on the order of 5 nanometers in the direction of an electric field created by the voltage applied to the gate electrode. This extremely thin superconducting channel can be easily realized or formed and the gate electrode, the gate insulator and the superconducting channel are arranged in a self alignment in accordance with the method of the present invention.

In a preferred embodiment, a c-axis orientated oxide superconductor thin film is formed to have the thickness on the order of about 20 nanometers. A gate electrode is formed on the c-axis orientated oxide superconductor thin film and the c-axis orientated oxide superconductor thin film is shaped into a superconducting channel, a superconducting source region, a superconducting drain region and a gate insulator which are formed integrally. Since under the gate electrode the gate insulator and the superconducting channel are stacked upper and lower, an upper portion of the shaped c-axis orientated oxide superconductor thin film having a thickness of more than 10 nanometers is convened into an oxide insulating layer so that a lower portion of the c-axis orientated oxide superconductor thin film becomes a superconducting channel having a thickness of about 5 nanometers. To convert the upper portion of the c-axis orientated oxide superconductor thin film into the oxide insulating layer, the portion is heated under high vacuum.

Particularly, according to the present invention, the heat-treatment is carried out by applying electric power to the gate electrode. The upper portion of the oxide superconductor thin film just under the gate electrode is converted into the gate insulator by the heat-treatment which heats the portion locally, so that the gate insulator is arranged just under the gate electrode and the superconducting channel is arranged just under the gate insulator, automatically.

Oxygen of crystals of an oxide superconductor escapes when the oxide superconductor is heated under vacuum. Superconducting properties of an oxide superconductor is sensitive to amounts of oxygen which is included in the crystals of the oxide superconductor. If the crystals of the oxide superconductor lack oxygen, the critical temperature of the oxide superconductor lowers considerably or the oxide superconductor loses its superconductivity.

Therefore, the upper portion of the c-axis orientated oxide superconductor thin film is converted into an oxide insulating layer substantially and the extremely thin oxide superconductor thin film can be formed. The thickness of the oxide insulating layer is controlled by the heat process time.

It is preferable to etch the oxide superconductor film so that side surfaces of a portion which will be converted into the oxide insulating layer, which are parallel to the c-axes of crystals of oxide superconductor, are exposed, since the oxygen of crystals of oxide superconductor migrates to a direction perpendicular to the c-axis of crystals of oxide superconductor easier.

In another preferred embodiment, the compound layer which does not show superconductivity but will become an oxide superconductor when which is heated in an oxygen atmosphere or when oxygen ions are injected is formed to have the thickness on the order of about 200 nanometers. A stacked structure including a gate insulator and a gate electrode is formed at an appropriate position on the compound layer. Oxygen ions are injected into two portions of the compound layer at both sides of the gate electrode using the gate electrode as a mask so that the portions are converted into a superconducting source region and a superconducting drain region. The portions of the compound layer at both sides of the gate electrode are etched using the gate electrode as a mask, so that a shallow step is formed on an upper surface of the compound layer. Since the superconducting channel is positioned under the gate electrode and between the superconducting source region and the superconducting drain region, the portion of the compound layer under the gate electrode having a thickness of about 5 nanometers is converted into an oxide superconductor. To convert the portion into superconductor, the portion is heated in an oxygen atmosphere.

Particularly, according to the present invention, the heat-treatment is carried out by applying electric power to the gate electrode. The portion of the compound layer under the gate electrode is convened into the superconducting channel by the heat-treatment which heats the portion locally, so that the superconducting channel is arranged under the gate electrode and just under the gate insulator, automatically.

Oxygen penetrates into a compound which is composed of the same constituent elements as those of an oxide superconductor but includes the oxygen amount less than that of the oxide superconductor when the compound is heated in an oxygen atmosphere. If oxygen diffuses into the compound, the compound changes to the oxide superconductor and gets superconductivity.

Therefore, the portion of the compound layer is converted into an extremely thin oxide superconductor thin film by the heat-treatment. The thickness of the oxide superconductor thin film is controlled by the heat process time. It is preferable to etch the compound layer so that side surfaces of a portion which will be converted into the oxide insulating layer, which are parallel to the c-axes of crystals of compound, are exposed, since the oxygen of crystals of compound migrates to a direction perpendicular to the c-axis of crystals of compound easier.

The extremely thin oxide superconductor thin film thus formed is very preferable in thickness and the crystal orientation to form a superconducting channel. In addition, according to the present invention, the gate electrode, the gate insulator and the superconducting channel are arranged in a self alignment.

As seen from the above, the method in accordance with the present invention includes no process which requires high-precision for forming the superconducting channel. Therefore, the limitation in the fine processing techniques required for manufacturing the super-FET can be relaxed.

The above and other objects, features and advantages of the present invention will be apparent from the following description of preferred embodiments of the invention with reference to the accompanying drawings.

BRIEF DESCRIPTION OF THE DRAWINGS

FIGS. 2A to 2I are diagrammatic sectional views for illustrating a second embodiment of the process in accordance with the present invention for manufacturing the super-FET.

DESCRIPTION OF THE PREFERRED EMBODIMENTS

Referring to FIGS. 1A to 1F, the process in accordance with the present invention for manufacturing the super-FET will be described.

Figure 1A:
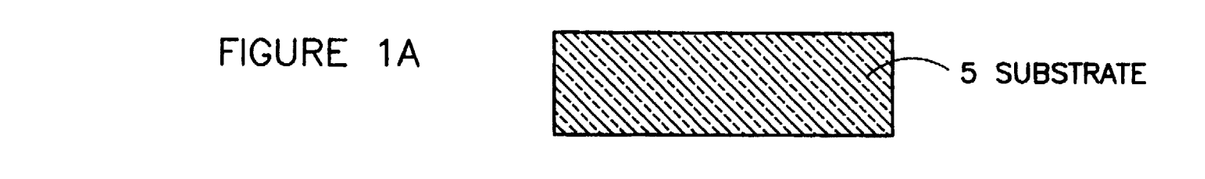
FIGS. 1A to 1F are diagrammatic sectional views for illustrating a first embodiment of the process in accordance with the present invention for manufacturing the super-FET.

As shown in FIG. 1A, a substrate 5 having a substantially planar principal surface is prepared. This substrate 5 is formed of for example, an insulator substrate such as a MgO (100) substrate, a SrTiO$_3$ (100) substrate, a CdNdAlO$_4$ (001) substrate or others, or a semiconductor substrate such as a silicon substrate having a principal surface coated with a buffer layer composed of an insulating film. In the case of the silicon substrate, the principal surface of the silicon is preferably coated with MgAlO$_4$ by a CVD (chemical vapor deposition) and also with BaTiO$_3$ by a sequential sputtering process.

Figure 1B:
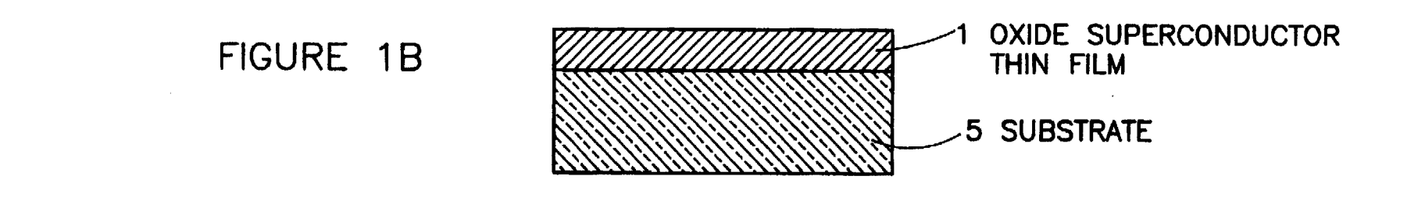

As shown in FIG. 1B, a c-axis orientated Y$_1$Ba$_2$Cu$_3$O$_{7-\delta}$ oxide superconductor thin film 1 having a thickness on the order of about 20 nanometers is deposited on the principal surface of the substrate 5, by for example an off-axis sputtering, a reactive evaporation, an MBE (molecular beam epitaxy), a CVD, etc. A lower portion of this oxide superconductor thin film 1 forms a superconducting channel 10 when the super-FET is completed. The superconducting channel is preferably formed of c-axis orientated thin film, since the c-axis orientated thin film has a large critical current density in the direction in parallel to the substrate surface. A condition of forming the c-axis orientated Y$_1$Ba$_2$Cu$_3$O$_{7-\delta}$ oxide superconductor thin film 1 by off-axis sputtering is as follows:

Sputtering Gas Ar:90%

O$_2$:10%

Pressure 10 Pa

Temperature of the substrate 700° C.

The oxide superconductor thin film is preferably formed of a high-T$_c$ (high critical temperature) oxide superconductor material, particularly a high-T$_c$ copper-oxide type compound oxide superconductor material, for example, a Bi—Sr—Ca—Cu—O type compound oxide superconductor material, or a Tl—Ba—Ca—Cu—O type compound oxide superconductor material other than Y—Ba—Cu—O type compound oxide superconductor material.

Figure 1C:
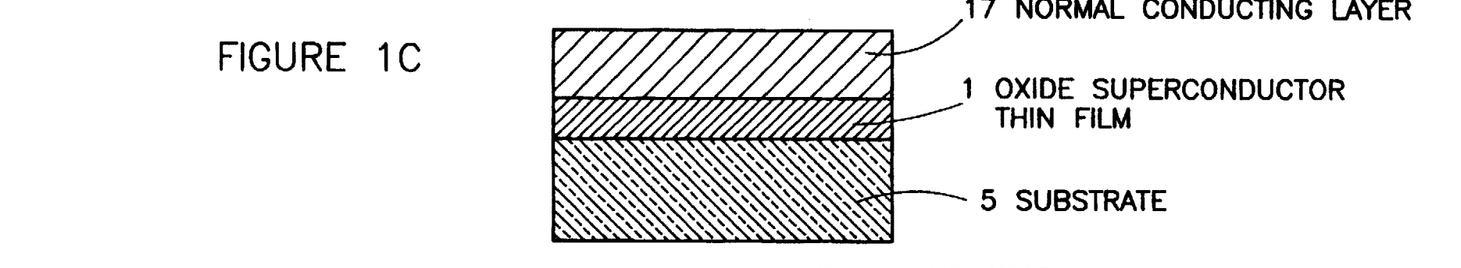

Then, as shown in FIG. 1C, a normal conducting layer 17 is deposited on the oxide superconductor thin film 1. The normal conducting layer 17 can be deposited by a vacuum evaporation or any other suitable process. The normal conducting layer 17 can be formed of Au, or a refractory metal such as Ti, W or a silicide thereof.

Figure 1D:
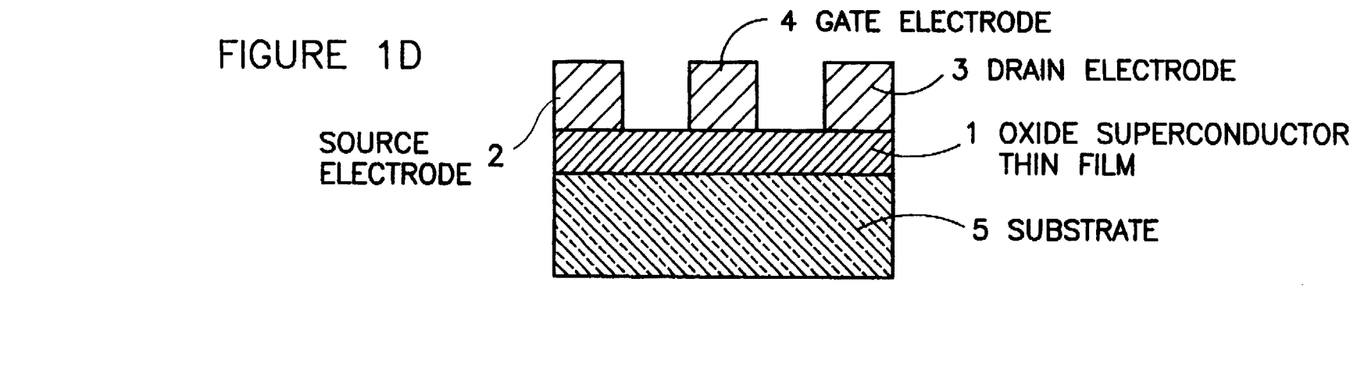

Thereafter, as shown in FIG. 1D, the normal conducting layer 17 is etched by a reactive ion etching process or an ion milling using Ar-ions so as to form a source electrode 2, a drain electrode 3 and a gate electrode 4. For this purpose, the normal conducting layer 17 is selectively etched, so as to remove all of the metal layer excluding portions which become the source electrode on the superconducting source region 12, the drain electrode on the superconducting drain region 13 and the gate electrode on the superconducting channel 10, so that the source electrode 2, the drain electrode 3 and the gate electrode 4 are formed on the oxide superconductor thin film 1 and the oxide superconductor thin film 1 is exposed excluding portions under the source electrode 2, the drain electrode 3 and the gate electrode 4.

Figure 1E:
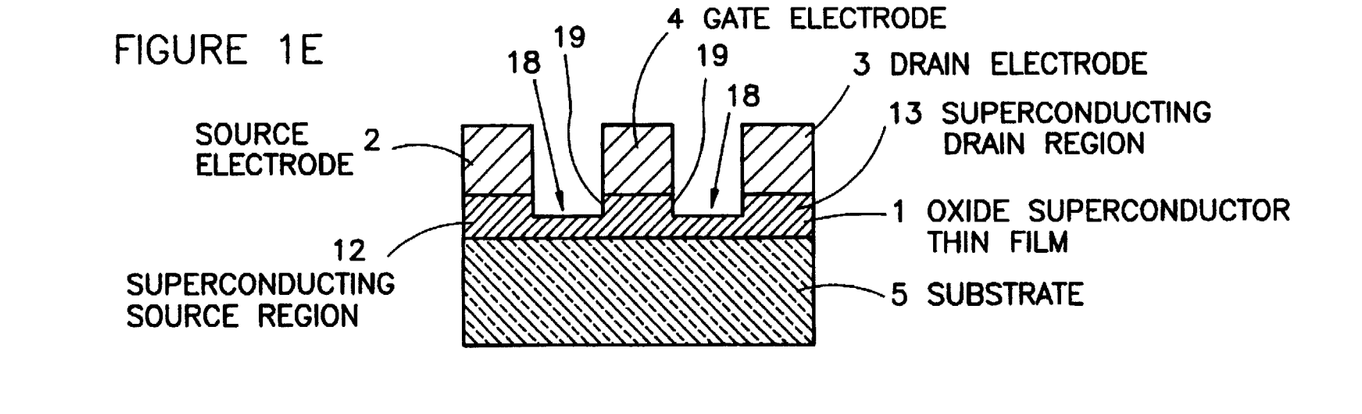

Thereafter, as shown in FIG. 1E, the exposed portions 18 of the oxide superconductor thin film 1 are selectively etched by a thickness of about 5 to 10 nanometers by a reactive ion etching process or an ion milling using At-ions in a self alignment to the patterned the source electrode 2, the drain electrode 3 and the gate electrode 4, so that the superconducting source region 12 and the superconducting drain region 13 are formed under the source electrode 2 and the drain electrode 3. A projecting portion of the oxide superconductor thin film 1 under the gate electrode 4 will be the gate insulator in future.

Figure 1F:
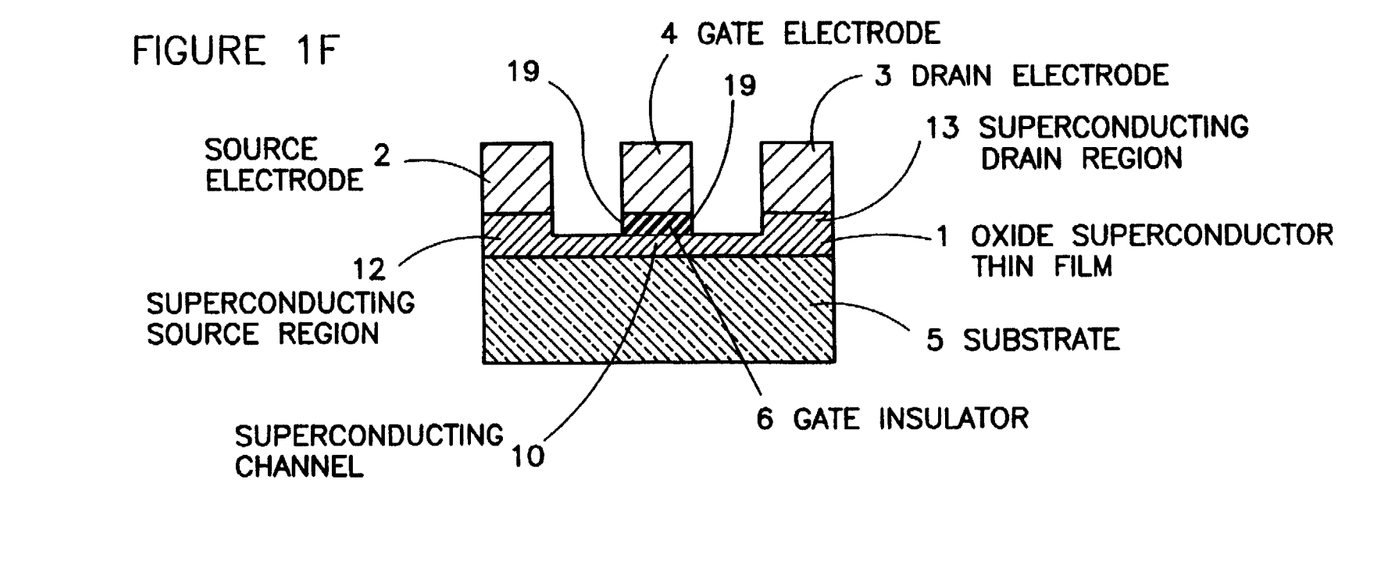

Then, the gate electrode 4 is applied electric power and heats up to more than 400° C. under a pressure of $10^{-5}$ Pa. The projecting portion of the oxide superconductor thin film 1 under the gate electrode 4 is heated locally and oxygen of the crystals of the portion escapes through side surfaces 19 so that the portion changes to the gate insulator 6. The portion of the oxide superconductor thin film 1 under the gate insulator 6 becomes the superconducting channel 10 which is constituted an extremely thin superconducting region, as shown in FIG. 1F. In this connection, the gate insulator 6 is formed to have a thickness sufficient to preventing a tunnel current, for example, a thickness of not less than 10 nanometers.

An oxide superconductor loses its superconductivity when it lacks oxygen of its crystals. Therefore, after the process, the oxide which forms gate insulator 6 becomes an oxide insulator for lack of oxygen. In above process the oxygen of the crystals of the oxide superconductor escapes only through sides 19, since the oxide superconductor has larger diffusion coefficients of oxygen along the a-axis and the b-axis of the crystal than along the c-axis. With this, the super-FET in accordance with the present invention is completed.

As explained above, if the super-FET is manufactured in accordance with the first embodiment of the method of the present invention, the limitation in the fine processing technique required for manufacturing the super-FET is relaxed. Since the flatness of the upper surface of the superconducting device can be improved, it become easy to form conductor wirings in a later process. Accordingly, it is easy to manufacture the super-FET with good repeatability, and the manufactured super-FET has a stable performance.

Referring to FIGS. 2A to 2I, a second embodiment of the process for manufacturing the superconducting device will be described.

Figure 2A:
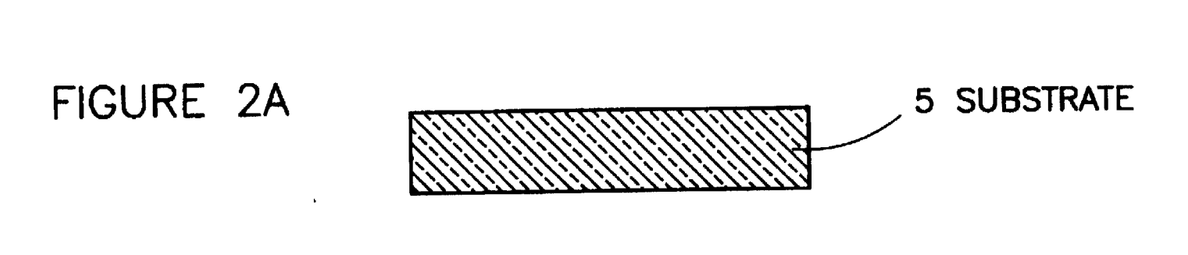

As shown in FIG. 2A, there is prepared a substrate 5, similar to the substrate 5 of the Embodiment 1.

Figure 2B:
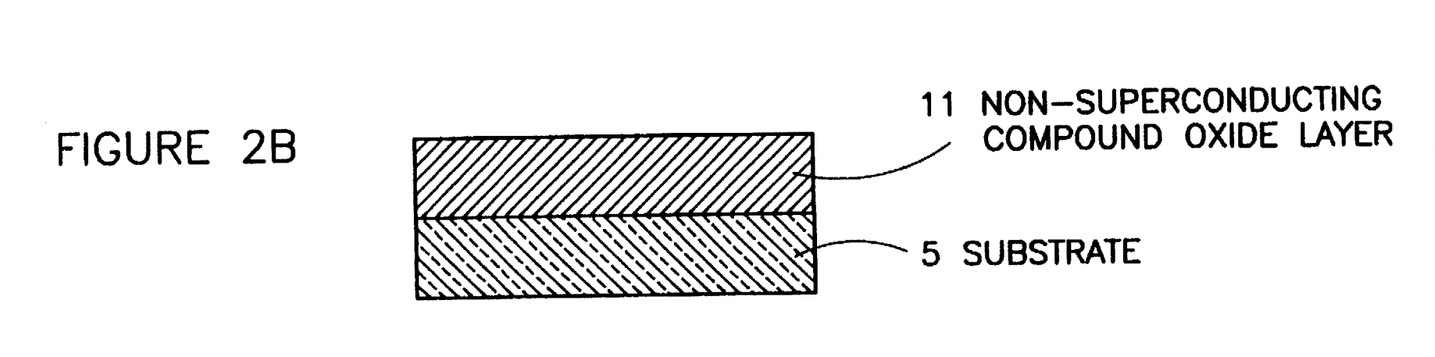

As shown in FIG. 2B, a compound oxide layer 11 of $Y_1Ba_2Cu_3O_{7-y}$ having a thickness of for example 200 nanometers is deposited on the principal surface of the substrate 5 by for example an off-axis sputtering. The off-axis sputtering is performed under the same condition as that of the first embodiment. Comparing $Y_1Ba_2Cu_3O_{7-y}$ with the $Y_1Ba_2Cu_3O_{7-\delta}$ oxide superconductor, they are formed of the same constituent elements, but $y>\delta$, namely, $Y_1Ba_2Cu_3O_{7-y}$ contains the oxygen number less than that of $Y_1Ba_2Cu_3O_{7-\delta}$ so that $Y_1Ba_2Cu_3O_{7-y}$ shows an electrical insulation. But, $Y_1Ba_2Cu_3O_{7-y}$ easily becomes $Y_1Ba_2Cu_3O_{7-\delta}$ if $Y_1Ba_2Cu_3O_{7-y}$ is heated in an oxygen atmosphere or if oxygen ions are injected.

In addition, a c-axis orientated thin film is preferably deposited, since the c-axis orientated thin film has a large critical current density in the direction in parallel to the substrate surface.

Figure 2C:
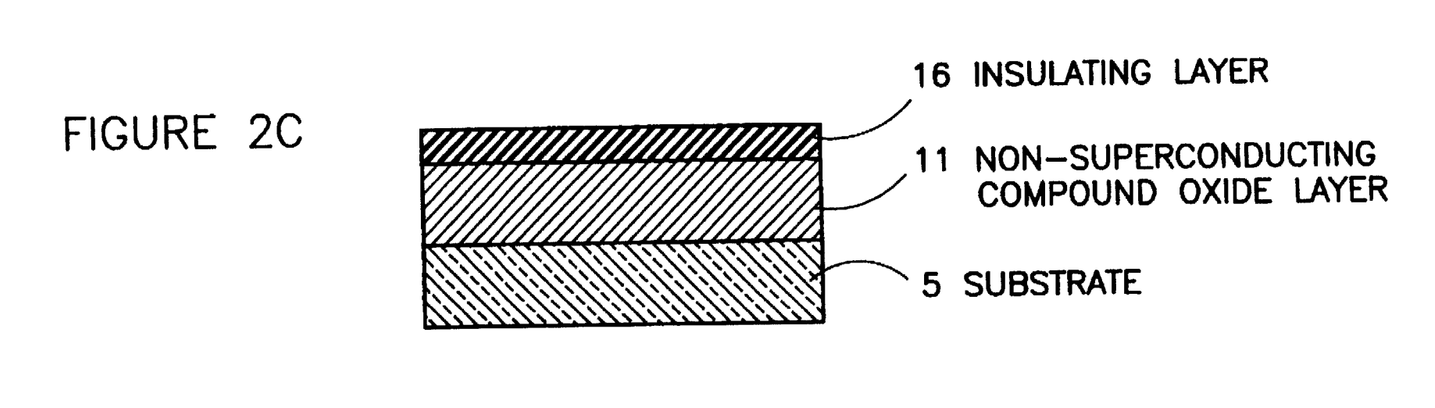

As shown in FIG. 2C, an insulating layer 16 formed of for example a silicon nitride is deposited to cover the whole surface of the oxide thin film 11. This insulating layer 16 has a thickness sufficient to preventing a tunnel current, for example, a thickness of not less than 10 nanometers. In addition, the insulating layer 16 is formed of an insulating material which does not form a large density of energy levels between the superconductor thin film and the insulating layer 16. Furthermore, in view of a mechanical stress, the insulating layer 16 is preferred to have a composition near to that of the oxide superconductor and be formed continuous on the oxide superconductor.

Figure 2D:
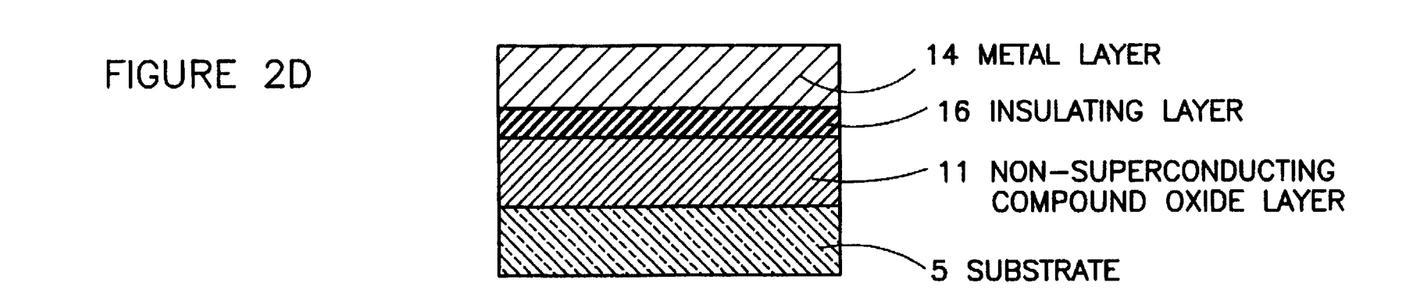

As shown in FIG. 2D, a metal layer 14 for a gate electrode is deposited on the insulating layer 16. The metal layer 14 is preferably formed of a refractory metal such as Ti, W, etc., or Au, or a silicide thereof.

Figure 2E:
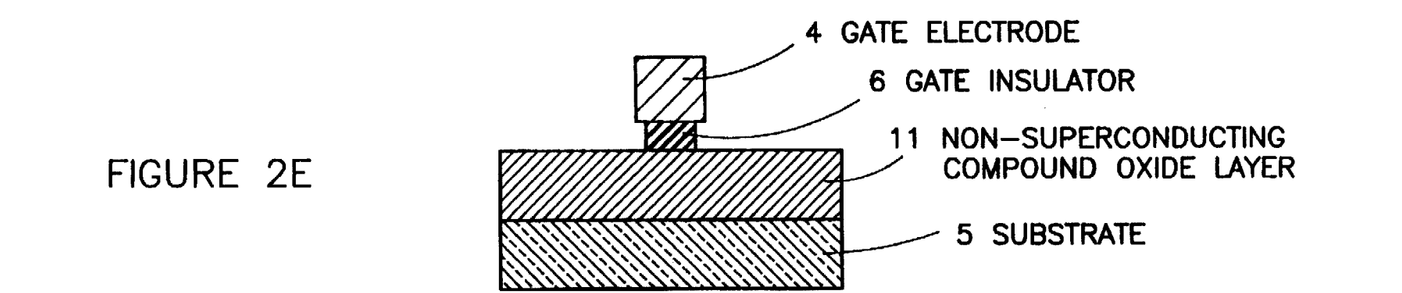

Thereafter, as shown in FIG. 2E, the stacked layer of the insulating layer 16 and the metal layer 14 is selectively removed so as to form a gate electrode. For this purpose, the metal layer 14 is selectively etched by a reactive ion etching process or an ion milling using At-ions so as to remove all of the metal layer excluding a portion which becomes the gate electrode on the superconducting channel 10, so that the gate electrode 4 is formed. Then, the insulating layer 16 is selectively etched by a reactive ion etching process or an ion milling using Ar-ions in a self alignment to the patterned gate electrode 4, so that a gate insulator 6 is left on the oxide thin film 11 and only under the patterned gate electrode 4. In this connection, it is desired that the gate insulator 6 is side-etched in comparison with the gate electrode 4, so that the gate insulator 6 has a length shorter than that of the gate electrode 4.

Figure 2F:
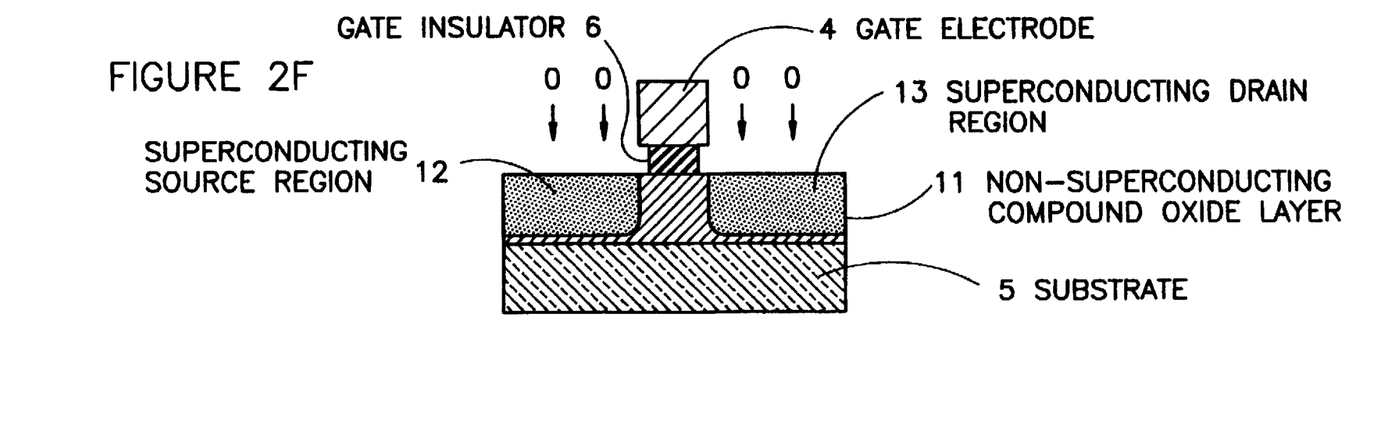
Figure 2G:
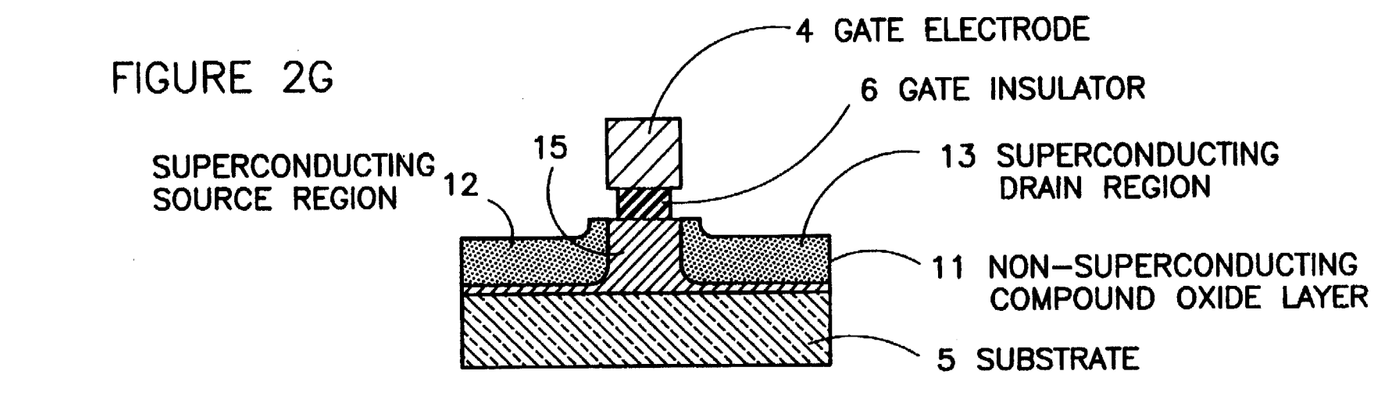

Thereafter, oxygen ions are ion-implanted so that a superconducting source region 12 and a superconducting drain region 13 having a substantial thickness are formed in the oxide thin film 11 as shown in FIG. 2F. The condition for the oxygen ion-implantation is that the acceleration energy is 40 KeV and the dose is $1\times10^{15}$ to $1\times10^{16}$ ions/cm$^2$. An exposed portion of the oxide thin film 11 are etched with Ar-ions by means of an anisotropic etching, so that a shallow step is formed and side surfaces of a portion 15 of the oxide thin film 11 under the gate insulator 6 are exposed, as shown in FIG. 2G.

Figure 2H:
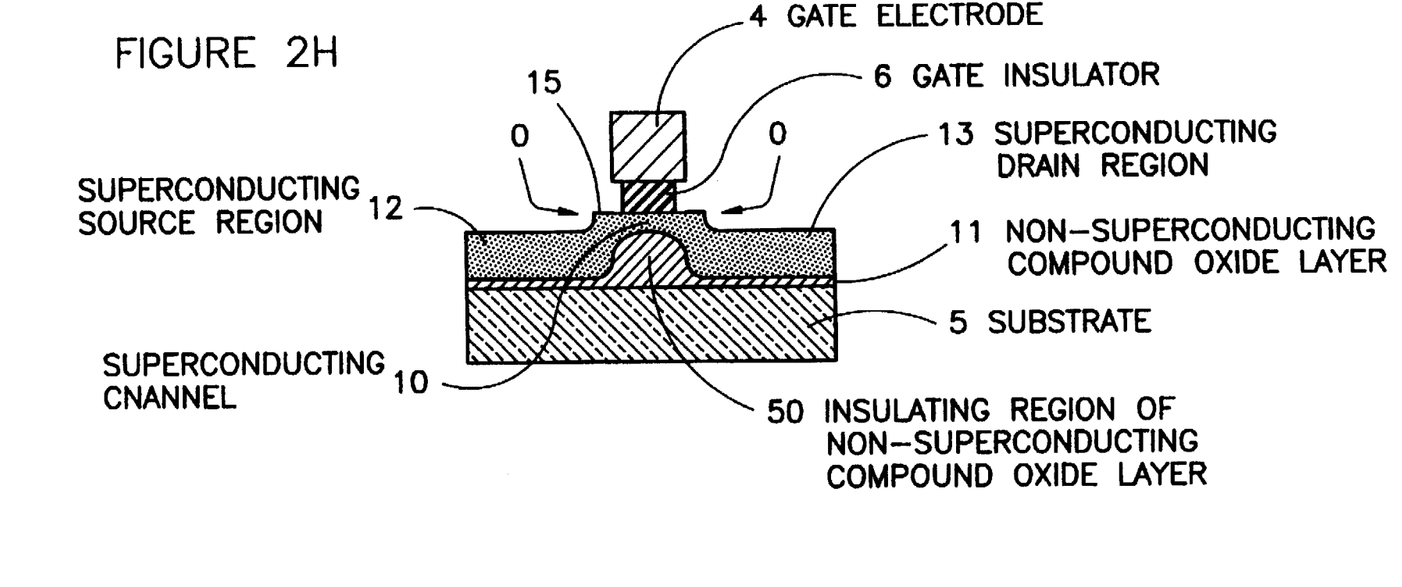

Then, the gate electrode 4 is applied electric power and heats up so as to heat the portion 15 of the oxide thin film 11 in an oxygen atmosphere, so that oxygen is diffused from the exposed side surfaces of the portion 15. As a result, a superconducting channel 10 is formed as shown in FIG. 2H. In this connection, the oxide thin film 1 is heated simultaneously, if necessary. The condition for the heat-treatment is that the temperature is 350° C., the partial oxygen pressure is $1\times10^4$ Pa and the time is one hour.

A portion of the oxide thin film 11 under the superconducting channel 10 is maintained in an insulating condition, and therefore, constitutes an insulating region 50.

Finally, as shown in FIG. 2I, a source electrode 2 and a drain electrode 3 are formed on the superconducting source region 12 and the superconducting drain region 13, respectively. The source electrode 2 and the drain electrode 3 are formed of for example a refractory metal such as Ti, W, etc., or Au, or a silicide thereof, similarly to the gate electrode 4.

As explained above, if the above mentioned super-FET is manufactured in accordance with the above mentioned process, the limitation in the fine processing technique required for manufacturing the super-FET is relaxed. In addition, since the substantially planarized upper surface is obtained, it become easy to form conductor wirings in a later process. Accordingly, it is easy to manufacture the super-FET with good repeatability, and the manufactured super-FET has a stable performance.

In the above mentioned four embodiments, the oxide superconductor thin film can be formed of not only the Y—Ba—Cu—O type compound oxide superconductor material, but also a high-$T_c$ (high critical temperature) oxide superconductor material, particularly a high-$T_c$ copper-oxide type compound oxide superconductor material, for example a Bi—Sr—Ca—Cu—O type compound oxide superconductor material, and a Tl—Ba—Ca—Cu—O type compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A superconducting field effect device comprising a substrate having an insulating surface, a c-axis oriented oxide superconductor film positioned directly on said insulating surface of said substrate, said superconductor film having, in a direction perpendicular to said surface of said substrate, three relatively thick portions of substantially uniform thickness located at opposing end portions of said device and at a central portion thereof, and relatively thin portions which electrically connect said thick portions, a source electrode and a drain electrode on said thick portions located at said opposing end portions, respectively, so that a superconducting current can flow through said thin portions between said source electrode and said drain electrode, and a gate electrode formed on said thick portion at said center portion of said device, said thick portion at said center portion having an upper film part and a lower film part, said upper film part being formed of a compound having the same constituent elements as the remainder of said oxide superconductor film but which includes oxygen in an amount less than the remainder of said oxide superconductor film whereby said upper part provides a gate insulating layer for said device, said upper film part having side surfaces which extend in said direction away from said lower film part and which are exposed, said side surfaces being parallel to said c-axis of said superconductor film, said lower film part providing a relatively thin superconducting channel, the thickness of said superconducting channel in said direction being substantially the same as the thicknesses of each of said relatively thin portions that electrically connect said thick portions, said thin portion and said channel being extremely thin in said direction, superconducting current flowing through said superconducting channel being controllable by voltage applied to said gate electrode, and said thick portions at said end portions providing a superconducting source region and a superconducting drain region which are separated from each other but electrically connected by said thin portions and said superconducting channel.

2. A superconducting field effect device as claimed in claim 1, wherein said superconducting channel has a thickness of about 5 nanometers.

3. A superconducting field effect device as claimed in claim 1, wherein said oxide superconductor thin film is formed of high-$T_c$ (high critical temperature) oxide superconductor.

4. A superconducting field effect device as claimed in claim 1, wherein said oxide superconductor thin film is formed of high-$T_c$ copper-oxide.

5. A superconducting field effect device as claimed in claim 4, wherein said oxide superconductor thin film is formed of oxide superconductor material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

6. A superconducting field effect device as claimed in claim 1, wherein said source electrode, said drain electrode and said gate electrode are formed of a refractory metal or a silicide thereof.

7. A superconducting field effect device as claimed in claim 1, wherein said source electrode, said drain electrode and said gate electrode are formed of a material selected from the group consisting of Au, Ti, W, and a silicide thereof.

8. A superconducting field effect device as claimed in claim 1, wherein said substrate is formed of a material selected from the group consisting of a MgO (100) substrate, a SrTiO$_3$ (100) substrate and a CdNdAlO$_4$ (001) substrate, and a semiconductor substrate.

9. A superconducting field effect device as claimed in claim 1, wherein said substrate is formed of a silicon substrate having a principal surface coated with an insulating material layer which is formed of a MgAl$_2$O$_4$ layer and a BaTiO$_3$ layer.

10. A superconducting field effect device comprising a substrate, a c-axis oriented oxide superconductor thin film formed on said substrate and having a projecting portion at a center portion of a surface of said oxide superconductor thin film, said projecting portion having side surfaces that are substantially parallel to said c-axis of said oxide superconductor thin film and that are exposed, and having a projecting insulating region which is formed of a compound that does not show superconductivity unless oxygen is introduced thereto and which smoothly projects from a center portion of said substrate so as to form a superconducting channel in said projecting portion, said channel being extremely thin in a direction perpendicular to said substrate, a relatively thick superconducting source region and a relatively thick superconducting drain region at both sides of said projecting portion, said channel having a thinnest portion in said direction and gradually becoming thicker, in said direction, where said channel meets said relatively thick source and drain regions, a source electrode and a drain electrode formed on said superconducting source region and said superconducting drain region, respectively, so that a superconducting current can flow through said superconducting channel between said source electrode and said drain electrode, and a gate electrode located through an insulator layer on said superconducting channel so as to control superconducting current flow through said superconducting channel, said superconducting source region and said superconducting drain region being separated by said projecting insulating region but electrically connected by said superconducting channel.

11. A superconducting field effect device as claimed in claim 10, wherein said superconducting channel has a thickness of about 5 nanometers.

12. A superconducting field effect device as claimed in claim 10, wherein said oxide superconductor thin film is formed of high-$T_c$ (high critical temperature) oxide superconductor.

13. A superconducting field effect device as claimed in claim 12, wherein said oxide superconductor thin film is formed of high-$T_c$ copper-oxide.

14. A superconducting field effect device as claimed in claim 12, wherein said oxide superconductor thin film is formed of oxide superconductor material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

15. A superconducting field effect device as claimed in claim 10, wherein said source electrode, said drain electrode and said gate electrode are formed of a refractory metal or a silicide thereof.

16. A superconducting field effect device as claimed in claim 10, wherein said source electrode, said drain electrode and said gate electrode are formed of a material selected from the group consisting of Au, Ti, W, and a silicide thereof.

17. A superconducting field effect device as claimed in claim 10, wherein said substrate is formed of a material selected from the group consisting of a MgO (100) substrate, a $SrTiO_3$ (100) substrate and a $CdNdAlO_4$ (001) substrate, and a semiconductor substrate.

18. A superconducting field effect device as claimed in claim 10, wherein said substrate is formed of a silicon substrate having a principal surface coated with an insulating material layer which is formed of a $MgAl_2O_4$ layer and a $BaTiO_3$ layer.

19. A superconducting field effect device comprising:

a substrate having an insulating surface;

a c-axis orientated oxide superconductor film positioned directly on said insulating surface of said substrate, said superconductor film having two grooves of equal depth with flat bottoms separately formed at an upper surface of said superconductor film so that side surfaces of said grooves are substantially parallel to said c-axis of the oxide superconductor film and so that said superconductor film defines, in a direction perpendicular to said surface of said substrate, three relatively thick portions of substantially uniform thickness located at opposing end portions and at a central portion thereof, and, under said flat bottoms of said grooves, relatively thin portions which electrically connect said thick portions, a source electrode and a drain electrode on said thick superconductor film portions respectively, so that a superconducting current can flow through said thin portions between said source electrode and said drain electrode; and a gate electrode formed on said thick portion at said central portion of said superconductor film;

said thick portion at said central portion of said superconductor film having an upper film part located between said grooves, said upper film part being formed of a compound having the same constituent elements as the remainder of said oxide superconductor thin film but which includes oxygen in an amount less than said remainder of said oxide superconductor film whereby said upper part provides a gate insulating layer for said device, and said thick portion at said central portion having a lower film part providing a relatively thin superconducting channel, said superconducting channel having a thickness in said direction that is substantially the same as the thickness of each of said relatively thin portions that electrically connect said thick portions, said thin portions and said channel being extremely thin in a direction perpendicular to said direction, superconducting current flowing through said superconducting channel being controllable by voltage applied to said gate electrode, and said thick portions providing a superconducting source region and a superconducting drain region which are separated from each other but electrically connected by said thin portions and said superconducting channel.

\* \* \* \* \*